United States Patent
Kim et al.

(10) Patent No.: US 7,481,351 B2
(45) Date of Patent: Jan. 27, 2009

(54) WIRE BONDING APPARATUS AND METHOD FOR CLAMPING A WIRE

(75) Inventors: Tae-Hyun Kim, Asan-si (KR);
Youn-Sung Ko, Cheonan-si (KR);
Young-Kyun Sun, Cheonan-si (KR);
Dae-Soo Kim, Cheonan-si (KR);
Kook-Jin Oh, Cheonan-si (KR);
Sang-Woo Lee, Cheonan-si (KR);
Dong-Bin Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 340 days.

(21) Appl. No.: 10/928,402

(22) Filed: Aug. 30, 2004

(65) Prior Publication Data
US 2005/0133563 A1     Jun. 23, 2005

(30) Foreign Application Priority Data
Dec. 23, 2003     (KR) .................. 10-2003-0095437
Mar. 25, 2004     (KR) .................. 10-2004-0020400

(51) Int. Cl.
*B23K 31/02*     (2006.01)
*B23K 37/04*     (2006.01)

(52) U.S. Cl. .................................. 228/180.5; 228/4.5

(58) Field of Classification Search ................. None
See application file for complete search history.

(56) References Cited

U.S. PATENT DOCUMENTS

| | | | | |
|---|---|---|---|---|
| 2,799,770 A | * | 7/1957 | Gates et al. | .................. 219/58 |
| 4,213,556 A | * | 7/1980 | Persson et al. | .............. 228/104 |
| 5,238,173 A | * | 8/1993 | Ura et al. | ..................... 228/104 |
| 6,156,990 A | * | 12/2000 | Ellis | ......................... 219/56.21 |
| 6,667,625 B1 | * | 12/2003 | Miller | ........................ 324/525 |
| 7,004,373 B1 | * | 2/2006 | Miller | ........................ 228/103 |

FOREIGN PATENT DOCUMENTS

| | | |
|---|---|---|
| JP | 10-107059 | 4/1998 |
| JP | 11-233551 | 8/1999 |
| KR | 1997-053168 | 7/1997 |

* cited by examiner

*Primary Examiner*—Kiley Stoner
(74) *Attorney, Agent, or Firm*—Harness, Dickey & Pierce, P.L.C.

(57) ABSTRACT

A controller may receive a wire disconnection signal from a wire bonding monitoring system and operate a wire clamp to clamp a disconnected wire. A series of operations, which may include a wire drawing operation, a wire tail forming operation and a ball forming operation, may be automatically performed. A sensor may measure the length of the wire drawn through the capillary and the location of a ball that may be formed at a wire tail. An auxiliary clamp may be installed between the wire clamp and the capillary for drawing the wire using sensor information.

23 Claims, 15 Drawing Sheets

WIRE BONDING APPARATUS AND METHOD FOR CLAMPING A WIRE

CROSS REFERENCE TO RELATED APPLICATION

This U.S. non-provisional application claims priority under 35 U.S.C § 119 from Korean Patent Application No. 2003-95437 which was filed on Dec. 23, 2003 and Korean Patent Application No. 2004-20400 which was filed on Mar. 25, 2004, the entire contents of both being incorporated herein by reference.

BACKGROUND OF THE INVENTION

1. Field of the Invention

The present invention relates generally to wire bonding apparatus and method and, more particularly, to a wire bonding apparatus capable of self-recovery when a wire disconnection occurs and a method for automatically forming a ball.

2. Description of the Related Art

Various methods may be implemented to electrically connect together a semiconductor chip to other components in a semiconductor package assembly. For example, wire bonding, flip chip bonding and tape automated bonding (TAB) methods may be employed to achieve such connections.

Among these methods, the wire bonding method using Au wire (for example) may be well known and employed in semiconductor package manufacture techniques. Au wire may have a lower bonding strength than other wire materials (such as Al or Cu wire, for example). Notwithstanding, the use of Au wire may have associated advantages. For example, Au wire may be more oxidation and contamination resistant as compared to other wire materials. Also, Au wire may be elongated and formed into a substantially spherical ball more easily as compared to other wire materials.

FIG. 1 illustrates a structure of a conventional wire bonding apparatus 50. Here, a wire 41 may be provided from a wire spool 39 and inserted into a capillary 32 through a wire clamp 33. The capillary 32 may include a transducer 31. The transducer 31 may transmit to the capillary 32 energy generated from an ultrasonic generator (not shown). The wire clamp 33 may be installed over the capillary 32 and configured to clamp the wire 41. A wire bonding monitoring system (WBMS) 38 may monitor the position and arrangement of a wiring substrate 20 and a semiconductor chip 24 before a wire bonding process occurs. The WBMS 38 also may transmit current to the transducer 31 during the wire bonding and monitor the current. When the wire 41 is disconnected during the wire bonding, the WBMS 38 may detect the change of the current value and transmit wire disconnection information to a host computer 37.

The wire clamp 33 may be controlled by the host computer 37. The wire clamp 33 may have a pair of plates between which the wire 41 may be clamped. The host computer 37 may manage a plurality of wire bonding apparatuses 50. The host computer 37 may transmit to a driver 34 a profile for controlling the opening and/or closing of the wire clamp 33 through a communication board 35, such as a digital to analog converter (DAC), for example. The profile from the host computer 37 may be considered as a control signal having plurality of time segments. During each time segment, the driver 34 may open or close the wire clamp 33. As the time segments become shorter, the profile may become finer. However, due to (among other things) the characteristics of the host computer 37, it may be difficult to reduce the length of a time segment to 500 μS or less. In other words, it may be difficult to change the state of the wire clamp 33 (from an opened condition to a closed condition, and vice versa) in 500 μs or less using the host computer 37.

A conventional wire bonding process using the wire bonding apparatus 50 is described below. The wire 41 may pass from the wire spool 39 through the transducer 31 and the capillary 32, while maintaining a predetermined tension by an air tension unit 40. The air tension unit 40 may maintain the predetermined tension by blowing air 42 across the wire 41. A high voltage spark blade (not shown) may apply an electric frame off (EFO) fire to a tail of the wire 41 to form a ball. A ball bonding process may be performed on an electrode pad 26 of the semiconductor chip 24. A loop having a predetermined trace may be formed. A stitch bonding process may be performed on a substrate pad of the wiring substrate 20. During the ball bonding and the stitch bonding processes, ultrasonic energy may be applied to the capillary 32 through the transducer 31 and heat may be applied to a target bonding area.

Faults may occur in the wire 41 during the wire bonding process. For example, the wire 41 may be inadvertently disconnected (e.g., experience a break) due to excessive force or material bouncing (for example), which may be applied to the capillary 32 during the stitch bonding process. When faults occur, the wire bonding apparatus 50 may stop operating. The operator may manually reinsert an end of the wire 41 into the capillary 32. The reinsertion operation may take a significant amount of time depending on (among other things) the skill of the operator. Such manual intervention by the operator may result in a reduction of productivity.

In an effort to overcome the drawbacks noted above, a wire bonding apparatus having a "self-recovery" feature has been conventionally implemented. When an inadvertent wire disconnect occurs, the "self-recovery" apparatus may automatically form a wire tail and then a ball, thereby allowing the wire bonding process to continue without operator intervention. Although conventional "self-recovery" apparatuses are generally thought to provide acceptable performance, they are not without shortcomings. For example, because the host computer 37 controls the opening and closing of the wire clamp of the wire bonding apparatus, a clamping operation of the wire clamp 33 may be ineffective when an inadvertent wire disconnect occurs. Specifically, if the wire becomes disconnected during the wire bonding process, the WBMS 38 may detect the change of the current flowing at the transducer 31 and transmit corresponding information to the host computer 37. The WBMS 38 may then receive signals from the host computer 37 to clamp the wire 41. It may take 1,000 μs or more from the occurrence of the inadvertent wire disconnect to the clamping operation. During this time, the wire 41 may slip and may become altogether removed from the capillary 32. Accordingly, notwithstanding the "self-recovery" feature, the operator may need to manually reinsert the end of the wire 41 into the capillary 32.

Further, the tail of the disconnected wire may be deformed in comparison with that of a normal wire. The use of the disconnected wire may result in abnormal ball formation, thereby resulting in a wire bonding fault.

SUMMARY OF THE INVENTION

An exemplary wire bonding apparatus may perform a wire clamping operation substantially simultaneously with the occurrence of an inadvertent wire disconnect, thereby minimizing the chance of a disconnected wire from slipping through the capillary.

An exemplary ball forming operation may remove a deformed end of a disconnected wire for forming a wire tail and a ball.

In an exemplary, non-limiting embodiment, a wire bonding apparatus may include a transfer rail that may transfer a wiring substrate having a semiconductor chip. A wire bonding unit may be installed adjacent to the transfer rail and configured to electrically connect the semiconductor chip to the wiring substrate by a wire.

The wire bonding unit may include a transducer, a wire clamp, a wire bonding monitoring system and a controller. The transducer may include a capillary receiving a wire. The wire clamp may be movable together with the capillary. The wire bonding monitoring system (WBMS) may monitor an electric current at the transducer. The controller may control the opening and closing of the wire clamp. The controller may close the wire clamp to clamp a disconnected wire in response to receiving a wire disconnection signal provided from the WBMS.

The wire bonding apparatus may further include a pre-bonding stage. The pre-bonding stage may be installed on the transfer rail. The pre-bonding stage may be a location at which the end of a disconnected wire may be removed from the capillary.

In an exemplary, non-limiting embodiment, a method may involve closing a wire clamp by a controller in response to receiving a wire disconnection signal provided by the WBMS so that a disconnected wire may be clamped. The wire may be moved to a specific position for forming a wire tail. The wire clamp may be opened and the wire may be drawn through the capillary to a predetermined length. The drawn wire may be pre-wire bonded to the specific position to form a wire tail. A spark may be applied to the wire tail to form a ball.

The method may further involve moving the wire from the specific position toward a wiring substrate and unit-wire bonding a semiconductor chip to the wiring substrate. A wire bonded portion may be inspected for off-set separation.

In another exemplary, non-limiting embodiment, a wire bonding unit may include a transducer having a capillary receiving a wire. The wire may be passable through the capillary in a wire draw direction to electrically connect a substrate to a semiconductor chip. A wire clamp may be provided upstream of the capillary relative to the wire draw direction. A system may monitor an electric current at the transducer and generate a wire disconnection signal upon detecting a change in the electric current indicative of a wire disconnect. A dedicated controller may close the wire clamp in response to receiving the wire disconnection signal provided by the wire bonding monitoring system.

In another exemplary, non-limiting embodiment, a method for clamping a wire during a wire bonding process may involve vibrating a transducer to draw a wire through a capillary, monitoring an electric current at the transducer, and generating a wire disconnection signal upon detecting a change in the electric current indicative of a wire disconnect. A system may generate the wire disconnection signal and supply the wire disconnection signal to a dedicated controller that controls a wire clamp to close so that a disconnected wire may be clamped.

BRIEF DESCRIPTION OF THE DRAWINGS

Exemplary, non-limiting embodiments of the present invention will be described with reference to the accompanying drawings in which like reference numerals designate like and corresponding structural elements.

DETAILED DESCRIPTION OF EXEMPLARY, NON-LIMITING EMBODIMENTS OF THE PRESENT INVENTION

Exemplary, non-limiting embodiments of the present invention will be described below with reference to the accompanying drawings. This invention may, however, be embodied in many different forms and should not be construed as limited to the embodiments set forth herein. Rather, the illustrated embodiments are provided so that this disclosure will be thorough and complete, and will fully convey the scope of the invention to those skilled in the art. Moreover, the figures are not drawn to scale. Rather, for simplicity and clarity of illustrations, some of the elements may be enlarged, reduced, and/or simplified.

Figure 2:
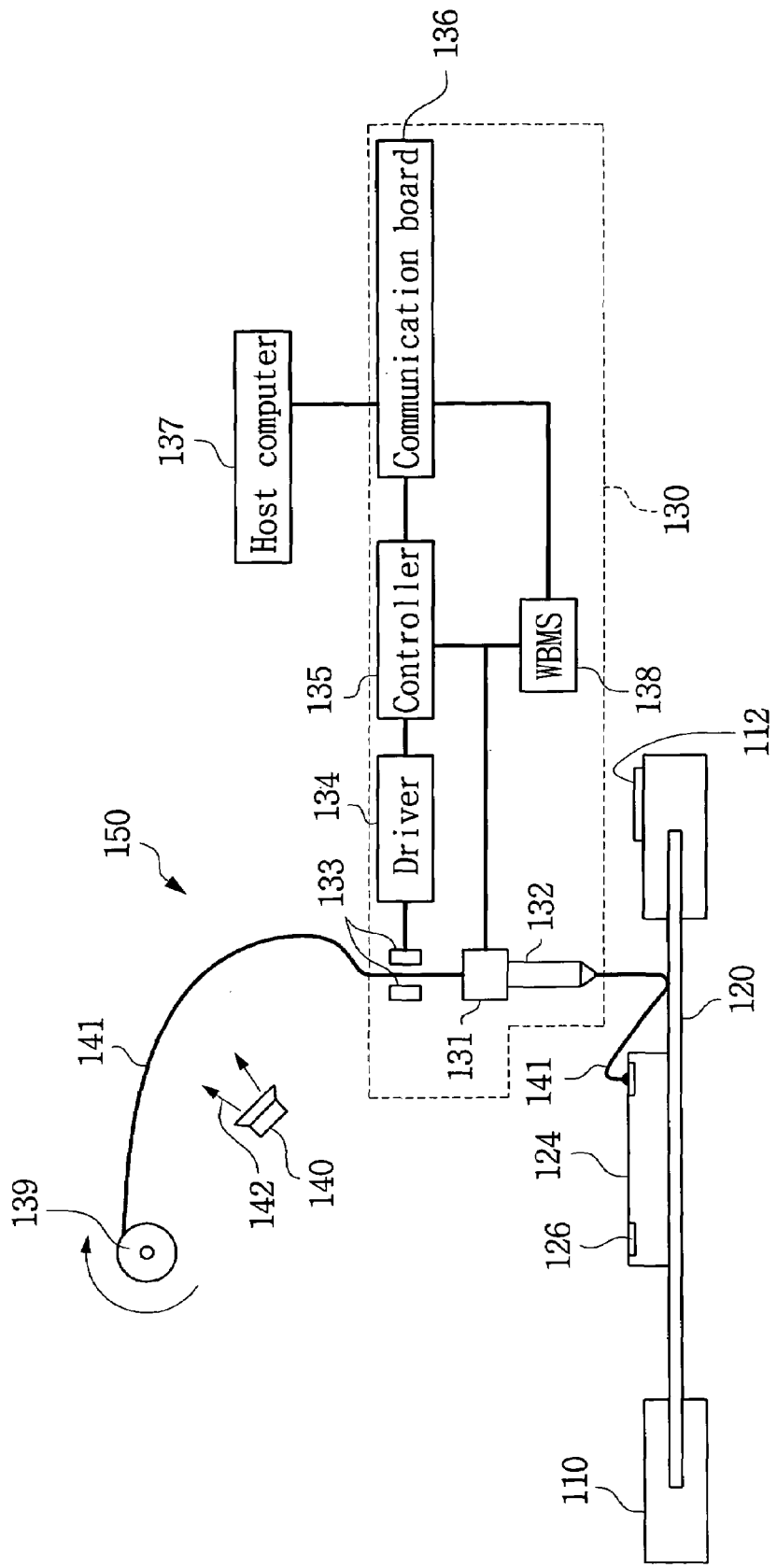
FIG. 2 is a schematic block diagram of a wire bonding apparatus in accordance with an exemplary, non-limiting embodiment of the present invention.
Figure 3:
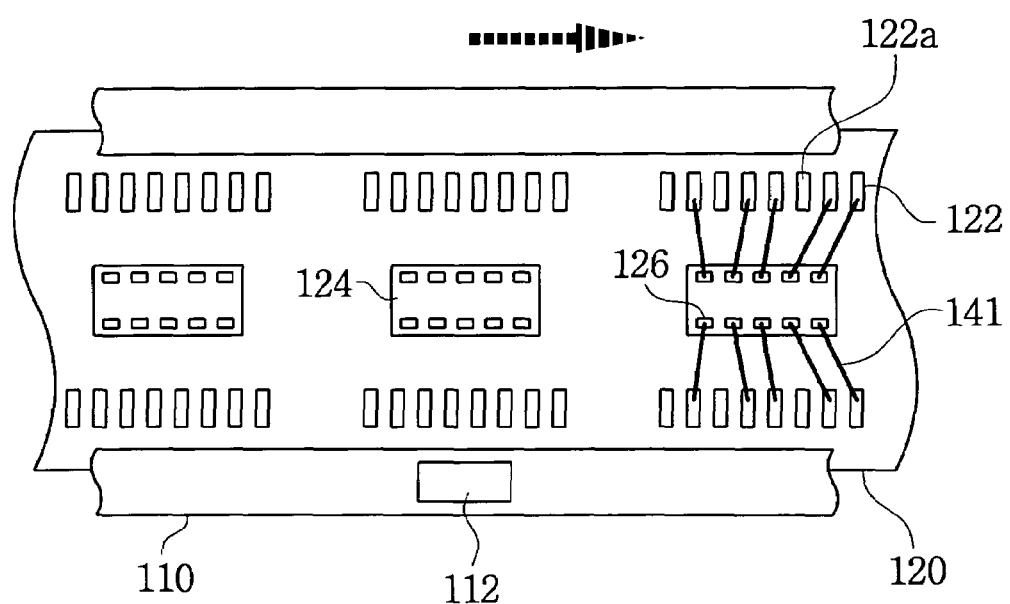
FIG. 3 is a plan view of a pre-bonding stage installed on a transfer rail in accordance with an exemplary, non-limiting embodiment of the present invention.

Referring to FIGS. 2 and 3, a wire bonding apparatus 150 may include a transfer rail 110 and a wire bonding unit 130. The transfer rail 110 may transfer a wiring substrate 120, which may have semiconductor chips 124 provided thereon. The wire bonding unit 130 may electrically connect the semiconductor chips 124 to the wiring substrate 120 via a wire 141. The wire bonding unit 130 may include a transducer 131, a wire clamp 133 and a wire bonding monitoring system (WBMS) 138. The transducer 131 may have a capillary 132 through which the wire 141 extends. The wire clamp 133 may be installed above the capillary 132 and may be configured to clamp the wire 141. The wire clamp 133 may be moveable together with the capillary 132. The WBMS 138 may monitor the wire bonding process via checking the electric current at the transducer 131. A wire spool 139 may supply the wire 141 to the wire bonding unit 130. An air tension unit 140 may direct air 142 toward the wire 141 so that the wire 141 may maintain a predetermined tension. A host computer 137 may be connected to the wire bonding apparatus 150 and may be configured to control the wire bonding apparatus 150. A communication board 136 may connect the host computer 137 to the wire bonding apparatus 150.

The wire bonding apparatus 150 may include a controller 135 and a pre-bonding stage 112. The controller 135 may control the opening and closing of the wire clamp 133. For example, the controller 135 may close the wire clamp 133 upon receiving a wire disconnection signal from the WBMS 138 to clamp a disconnected wire. The pre-bonding stage 112 may be installed on the transfer rail 110.

The WBMS 138 may detect the position and arrangement of the wiring substrate 120 and the semiconductor chip 124 to monitor the wire bonding process. The WBMS 138 may send current to the transducer 131 during the wire bonding process and may monitor the current. If the wire 141 becomes disconnected, the WBMS 138 may detect the change of the current value and transmit wire disconnection information (e.g., the wire disconnection signal) to the controller 135. The WBMS 138 may also transmit the wire disconnection information to the host computer 137, which may manage a plurality of wire bonding apparatuses 150. In this way, the host computer 137 may be notified as to which wire bonding apparatus the wire disconnection occurred and the host computer 137 may initiate a process for automatically forming a ball in the wire bonding apparatus having the disconnected wire.

The controller 135 may be connected to a driver 134 of the wire clamp 133. The controller 135 may transmit to the driver 134 a profile for controlling the opening and/or closing of the wire clamp 133. The profile from the controller 135 may be considered as a control signal having plurality of time segments. During each time segment, the driver 134 may open or close the wire clamp 33. The controller 135 may also be connected to the host computer 137 through the communication board 136, such as a digital to analog converter (DAC), for example. The controller 135 may also be connected to the WBMS 138 for receiving signals (such as the wire disconnection signal, for example) related to the opening and closing of the wire clamp 133.

According to convention, the host computer, which may manage a plurality of wire bonding apparatuses, may control the opening and closing of the wire clamp. In contrast, in this example embodiment, the controller 135 may control the opening and closing of the wire clamp 133. In this regard, the controller 135 may be considered as a dedicated controller to the extent that it may control the operation of the wire clamp 133 of only a single wire bonding apparatus 150.

Figure 1:
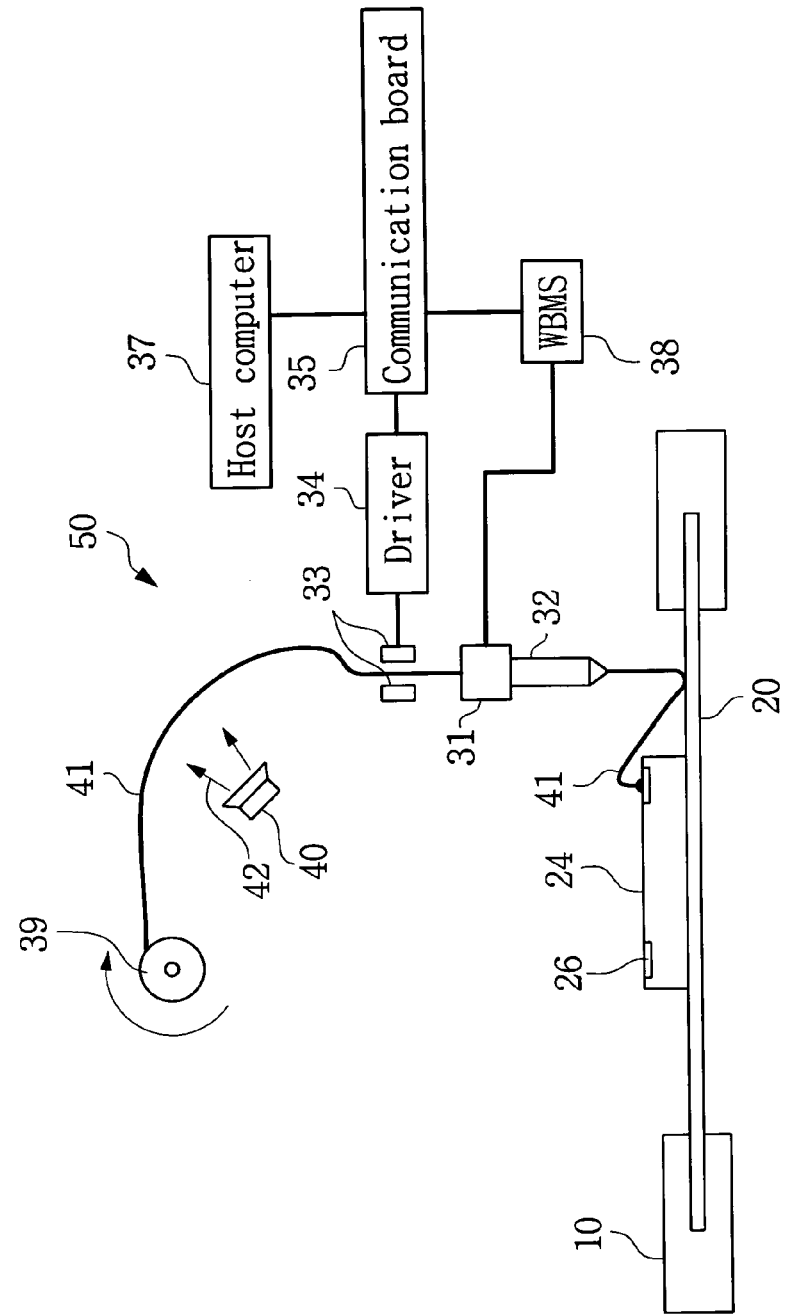
FIG. 1 is a schematic block diagram of a conventional wire bonding apparatus.

As compared to conventional structures, the structure of this example embodiment may provide a more direct path for the signals controlling the clamping operation. For example, the wire disconnection signal may travel from the WBMS 138 directly to the controller 135, which may generate and supply the profile directly to the driver 134. The controller 135 may generate a profile having segments of approximately 100 μs. Such profiles may not be achievable in conventional structures at least in part because of the indirect path of the signals controlling the clamping operation. For example, and with reference to FIG. 1, a wire disconnection signal may travel from the WBMS 38 and through the communication board 35 to the host computer 37, and then the host computer generates a profile that passes through the communication board 35 to the driver 34. Also, in conventional structures, the shared nature of the host computer 37 may cause delays in processing of signals associated with the clamping operation.

A profile having segments of approximately 100 μs may allow the opening and closing of the wire clamp 133 to be controlled with one start bit, thereby performing a clamping operation of a disconnected wire substantially simultaneously with transmission of the wire disconnection signal. Thus, this example embodiment may reduce the chance of an unintended disconnected wire from slipping through and becoming altogether removed from the capillary 132.

The pre-bonding stage 112 may be provided so that the end of the disconnected wire may be removed from the capillary 132. In so doing, a wire tail and a ball may be automatically formed through a cycle of wire bonding (hereinafter referred to as a "pre-wire bonding" operation). The end of the disconnected wire may be deformed in comparison to a wire tail formed during a normal, uninterrupted wire bonding process. If a high voltage spark were applied to the deformed end of the disconnected wire to form a ball, then the resulting ball may have a shape other than a desired spherical shape. The abnormal end of the disconnected wire may be removed at the pre-bonding stage 112 through the pre-wire bonding operation to form a wire tail suitable for forming a desired ball (i.e., without defects). Alternatively, the pre-wire bonding operation may be performed on the wiring substrate 120. In this case, the pre-wire bonding operation may involve forming the wire tail using a dummy substrate pad 122a (See FIG. 3) of the substrate pads 122 provided on the wiring substrate 120.

The pre-bonding stage 112 may be installed on the transfer rail 110. For example, the pre-bonding stage 112 may be provided on one or both ends of the transfer rail 110. The pre-bonding stage 112 may be elongated in the installation direction of the transfer rail 110. However, it will be appreciated that the pre-bonding stage 112 may have a variety of alternative shapes and still accommodate the pre-wire bonding operation. The pre-bonding stage 112 may be fabricated from materials that may reduce damage to the capillary 132 during the pre-wire bonding operation and that are bondable to the wire 141. The materials may include iron alloy, copper alloy, or any other suitable material as is well known in this art. The pre-bonding stage 112 and the substrate pads 122, 122a of the wiring substrate 120 may be fabricated from the same materials or different materials.

Figure 4:
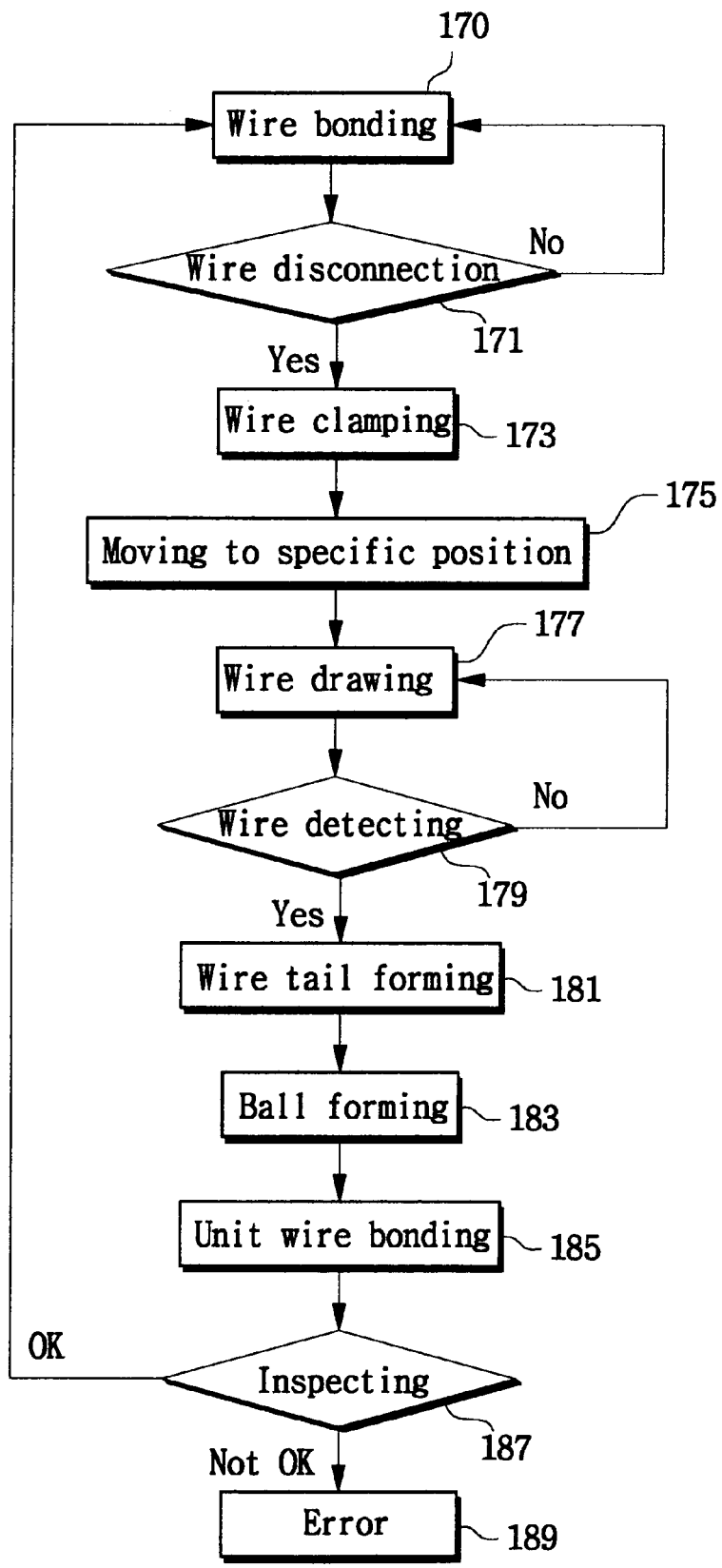
FIG. 4 is a flow chart of a method for automatically forming a ball that may be performed by the wire bonding apparatus of FIG. 2.

FIG. 4 is a flow chart of a method for automatically forming a ball that may be implemented using the wire bonding apparatus of FIG. 2. FIG. 5A through FIG. 12 schematically illustrate various operations of the method of FIG. 4.

The wire bonding process 170 may be performed by the wire bonding unit while wiring substrates having semiconductor chips may be provided by the transfer rail. If an inadvertent wire disconnect does not occur during the wire bonding process 170 (No at 171), then the wire bonding process 170 may continue. If an inadvertent wire disconnect occurs (Yes at 171), then a wire clamping operation 173 may begin, and a ball forming operation 183 may follow, which may lead to a continuous wire bonding process 170. The following discussion of this example embodiment is presented with an inadvertent wire disconnect occurring during a stitch bonding process. It will be appreciated, however, that such a disconnect may occur at any time during the wire bonding process. In all cases, the example embodiment may provide an effective "self-recovery" feature.

When an inadvertent wire disconnect occurs (Yes at 171), then a wire clamping operation (173 of FIG. 4) may be performed to clamp the disconnected wire 141. The wire clamping operation will be discussed with reference to FIGS. 5A through 6. As a result of the wire disconnect, changes may occur in the amount of current flowing at the transducer 131. The WBMS 138 may detect the current change and transmit the wire disconnection signal to the controller 135. The controller 135 may transmit to the driver 134 an order profile to close the wire clamp 133, thereby clamping the disconnected wire 141.

Figure 6:
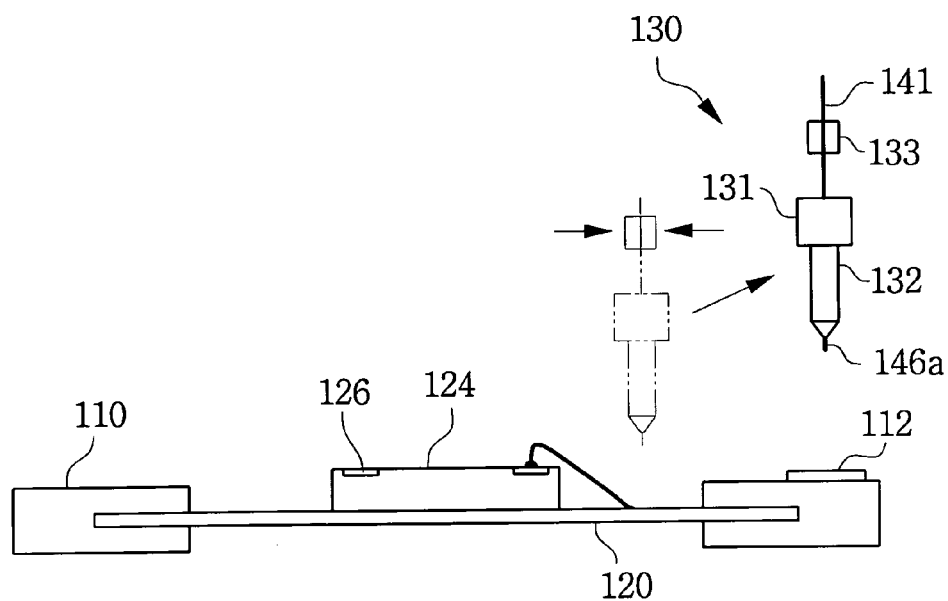
FIGS. 6 and 7 are schematic views of a moving operation according to an exemplary, non-limiting embodiment of the present invention.

The controller 135 may generate the profile as a segment of approximately 100 μs (t2). Thus, the closing or opening of the wire clamp 133 may be controlled by one start bit. In this way, the disconnected wire 141 may be clamped substantially simultaneously with transmission of the wire disconnection signal from the WBMS 138. This may reduce the chance of the disconnected wire 141 from slipping through and becoming completely removed from the capillary 132. Reference numeral 146a of FIG. 6 is an end portion of the wire that may be exposed through the capillary 132 after an unintended disconnect has occurred.

Figure 5A:
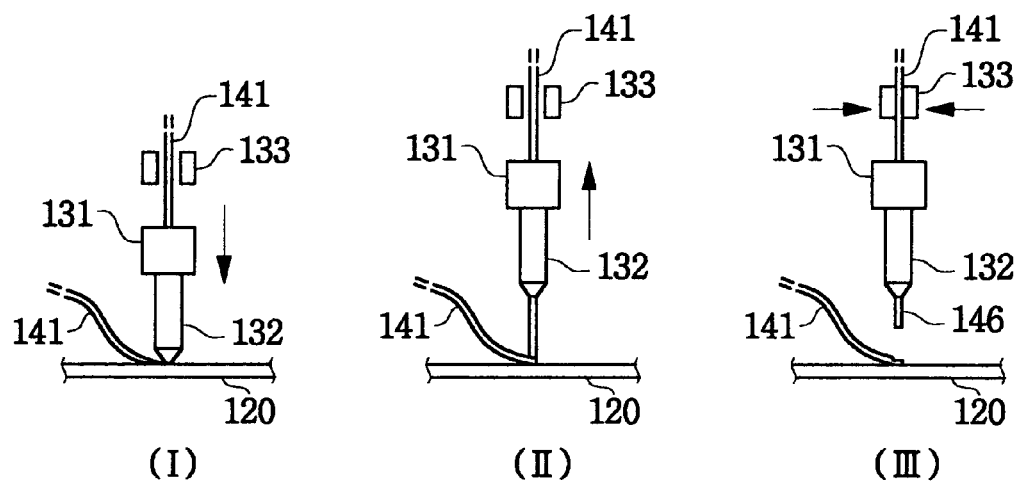
FIGS. 5A-5C are schematic views of wire clamping operations according to an exemplary, non-limiting embodiment of the present invention and the conventional art.

As shown in FIG. 5A, the wire 141 may be stitch-bonded to a wiring substrate 120 by the capillary 132 (I). The capillary 132 may be moved upward to a position for forming a wire tail (II). The wire clamp 133 may clamp the wire 141 and the capillary 132 may be moved upward, so that an intentional wire disconnect may occur at a weak portion of the wire 141, or at the stitch-bonded portion, to form the wire tail 146 (III).

Figure 5B:
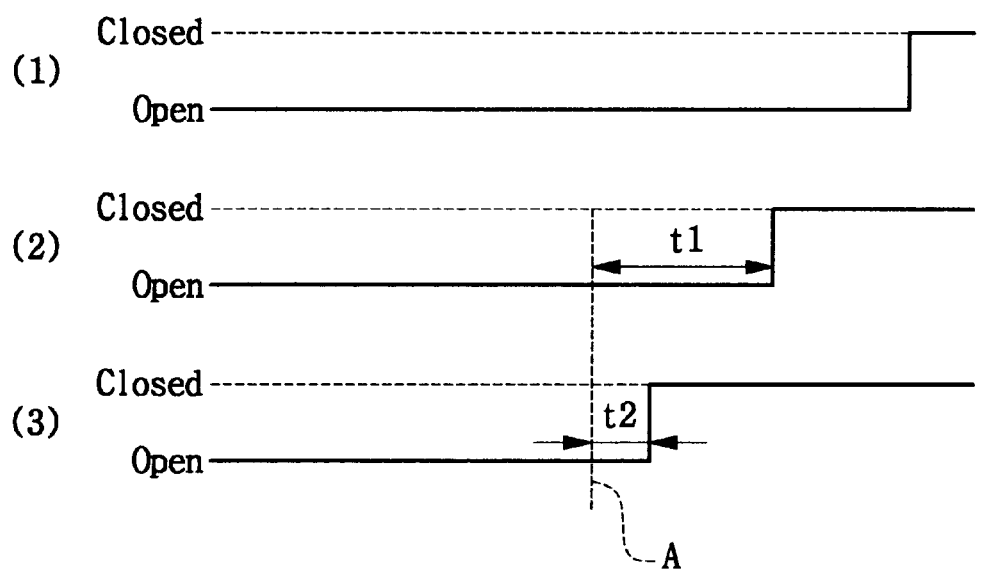
Figure 5C:
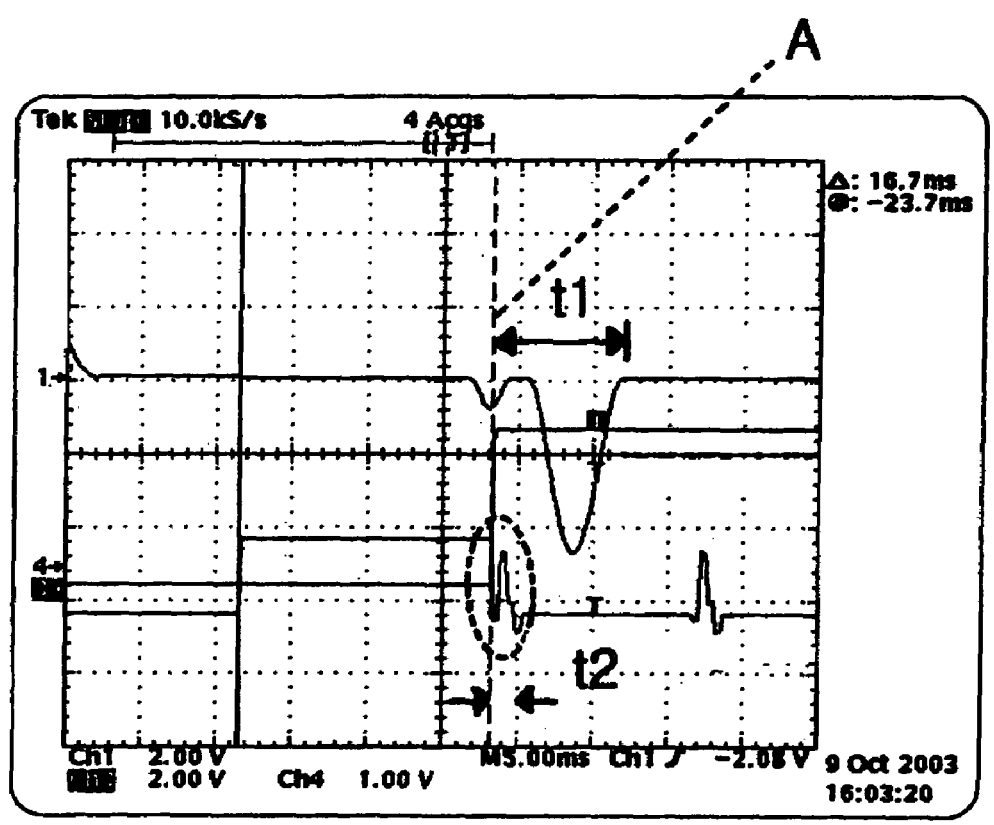

FIGS. 5B and 5C compare a wire clamping time of the example embodiment of the present invention and the conventional art. The clamping time may be measured when an unintended wire disconnect occurs at a time A, when the wire clamp may be in an open condition. The time A may be before the capillary 132 has completed its movement to a position for forming the wire tail 146 and may be after the stitch bonding process.

FIG. 5B(1) depicts a clamping operation that may occur during a wire bonding process in which an unintended wire disconnect does not occur. Here, at an appropriate timing, the wire clamp 133 may be moved from the open condition to a closed condition to clamp the wire 141. With the wire clamp 133 in the closed condition, the capillary 132 may be moved upward to create an intentional wire disconnect 141, thereby forming a wire tail 146 (see FIG. 5A(III)).

FIG. 5B(2) depicts the wire clamping time of a conventional structure. The conventional host computer may control the opening and closing of the wire clamp. From the occurrence of the unintended wire disconnect (at time A), it may take approximately 800 μs (t1) for the wire clamp to begin closing. This may result in the wire slipping through the capillary and not clamped by the wire clamp.

FIG. 5B(3) depicts the wire clamping time of the example embodiment of the present invention. The controller 135 may control the opening and closing of the wire clamp 133. From the occurrence of the unintended wire disconnect (at time A), it may take approximately 100 μs (t2) for the wire clamp to clamp the disconnected wire 141. Therefore, the disconnected wire 141 may be clamped substantially simultaneously with transmission of the wire disconnection signal provided by the WBMS 138. As a result, the chances of an unintentionally disconnected wire slipping through and becoming removed from the capillary 132 may be reduced.

Figure 7:
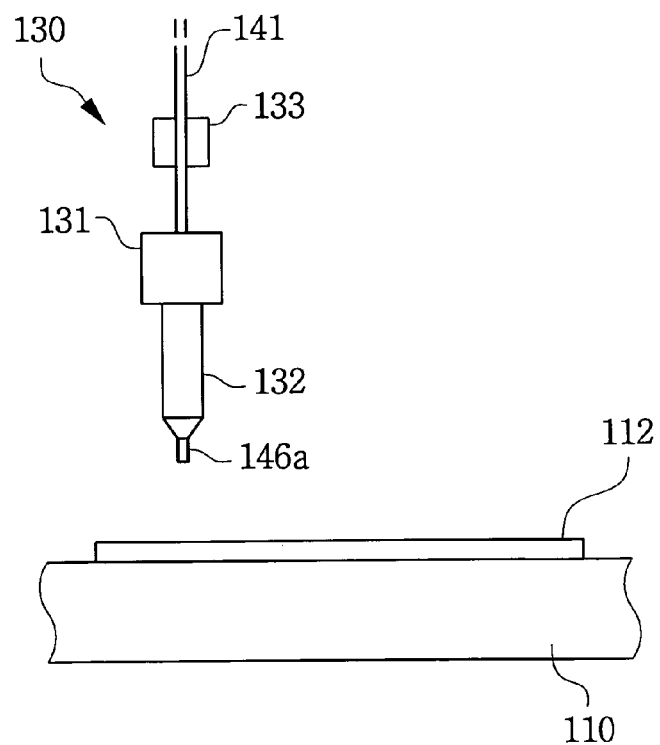

FIGS. 6 and 7 illustrate a moving operation (175 of FIG. 4) that may be performed to move the disconnected wire to a specific position. The wire bonding unit 130 clamping the disconnected wire 141 may be moved to a specific position to form a wire tail, which may be subsequently used for forming a ball. The transducer 131 may be moved above an upper surface of the specific position. The position for forming a wire tail may correspond with the height of a substrate pad of the wiring substrate 120. In this example embodiment, the specific position may be the pre-bonding stage 112. However, it will be appreciated that the invention is not limited in this regard. For example, the specific position may be a dummy substrate pad (122a of FIG. 3). In this example embodiment, the pre-bonding stage 112 may be elongated in an installation direction of the transfer rail 110 (as shown in FIG. 3) and the pre-wire bonding operation may proceed in the installation direction of the transfer rail 110. However, it will be appreciated that the invention is not limited in this regard. For example, the pre-bonding stage 112 may be elongated in a direction perpendicular to the installation direction of the transfer rail 110 and the pre-wire bonding operation may proceed in the installation direction of the pre-bonding stage 112 (i.e., perpendicular to the installation direction of the transfer rail 110).

Figure 8:
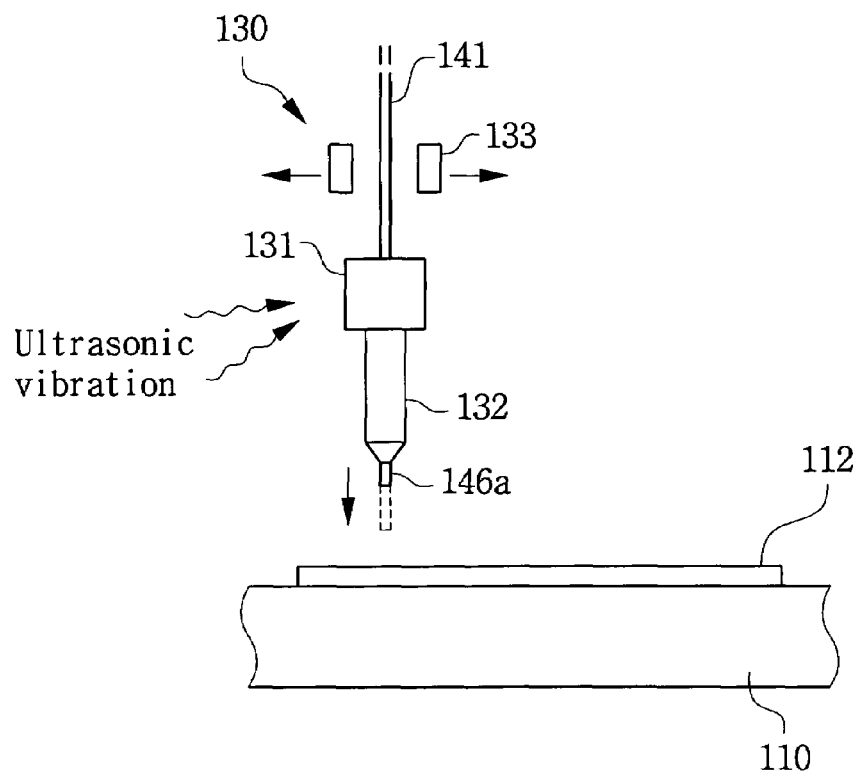
FIGS. 8 and 9 are schematic views of a wire drawing operation according to an exemplary, non-limiting embodiment of the present invention.
Figure 9:
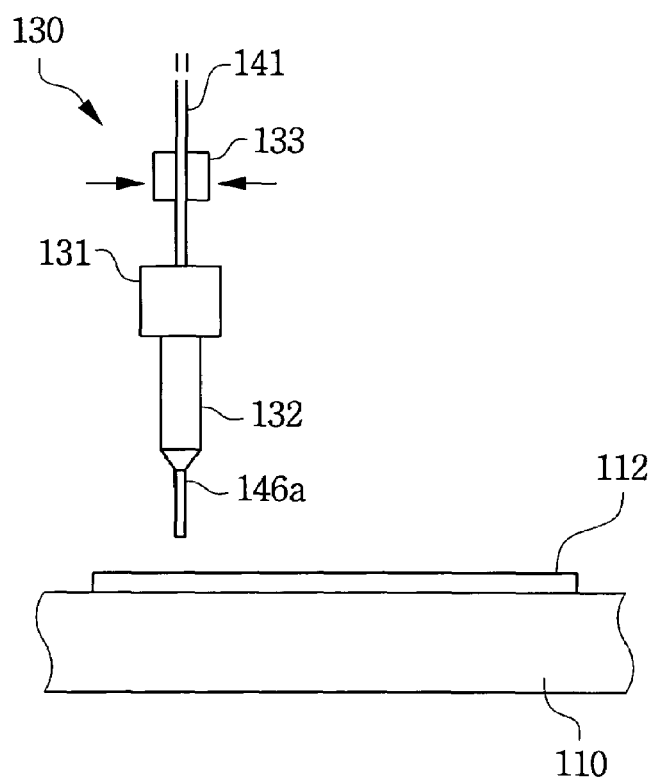

FIGS. 8 and 9 illustrate a wire drawing operation (177 of FIG. 4) that may be preformed. As shown in FIG. 8, the closed wire clamp 133 may be opened. Ultrasonic vibration may be applied to the transducer 131 to draw the wire through the capillary 132 so that the exposed end portion 146a of the wire may have a predetermined length below the capillary 132. As shown in FIG. 9, the open wire clamp 133 may be closed to complete the wire drawing operation. The exposed end portion 146a of the wire, which is drawn below the capillary 132, may be used as a wire tail in the pre-wire bonding operation.

Figure 10A:
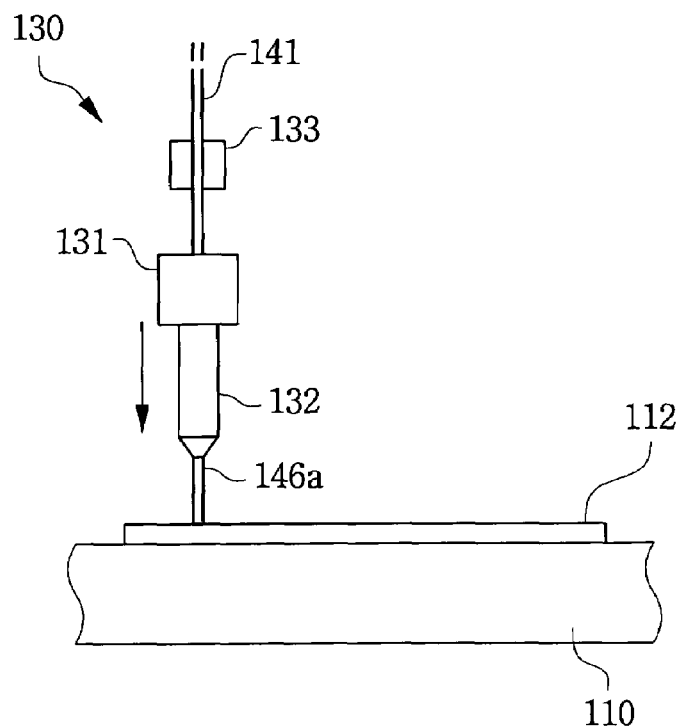
FIGS. 10A and 10B are schematic views of a wire detecting operation according to an exemplary, non-limiting embodiment of the present invention.
Figure 10B:
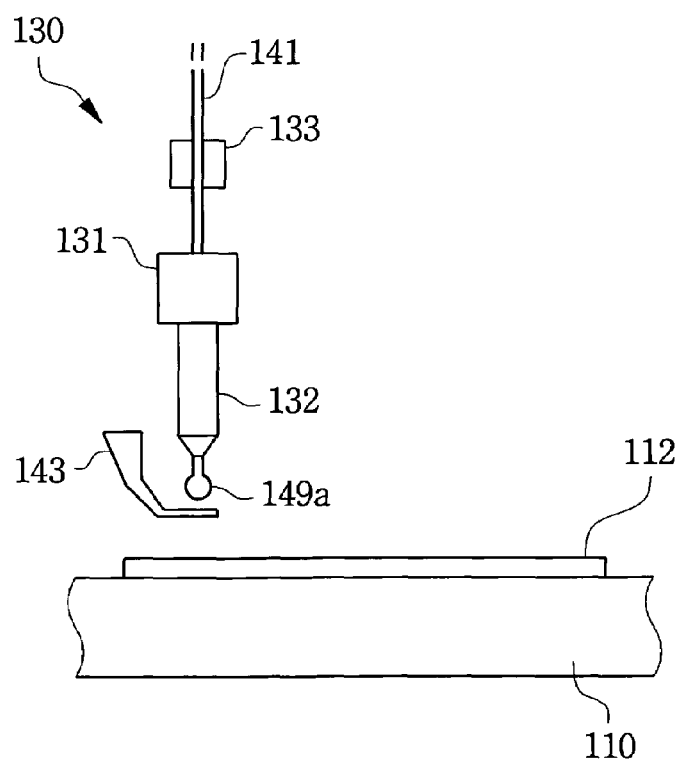

FIGS. 10A and 10B illustrate a wire detecting operation (179 of FIG. 4) that may be performed to determine whether the exposed end portion 146a is drawn to a predetermined length below the capillary 132. As shown in FIG. 10A, the transducer 131 may be moved downward above the pre-bonding stage 112. The WBMS 138 may detect the change of the current according to the contact of the exposed end portion 146a of the wire with the pre-bonding stage 112. If a current change is not detected (which may indicate that the wire may not be drawn to the predetermined length), then the wire drawing operation (177 of FIG. 4) may be repeated.

It will be appreciated that the invention is not limited to the specific wire detecting operation discussed above. For example, and with reference to FIG. 10B, a high voltage spark blade 143 may apply a high voltage spark to the exposed end portion of the wire. The WBMS 138 may detect the electric current at the transducer 131. If the wire is drawn below the capillary 132, a ball 149a may be formed at the end of the wire. The formed ball may have a substantially spherical shape.

It will be appreciated that other, alternative detecting means, such as a sensor (for example) may be suitably implemented in the wire detecting operation.

Figure 11A:
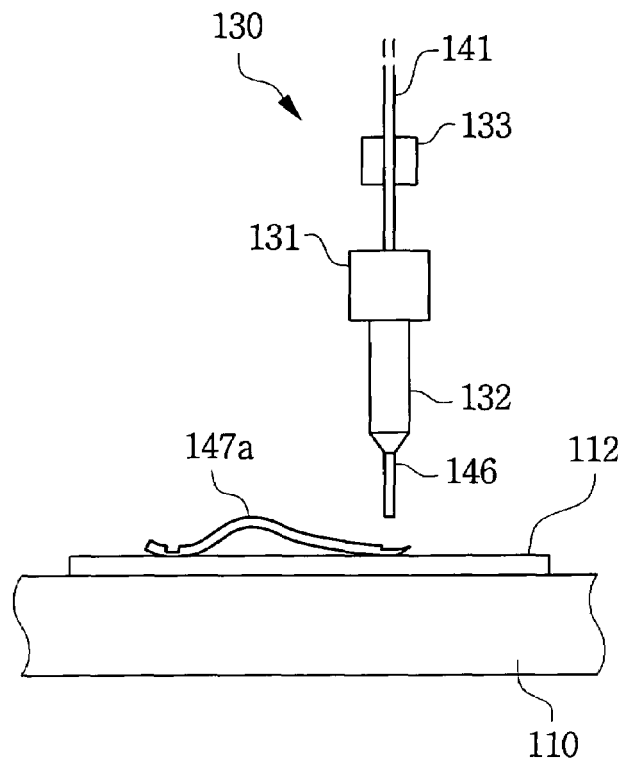
FIGS. 11A and 11B are schematic views of a wire tail forming operation according to an exemplary, non-limiting embodiment of the present invention.
Figure 11B:
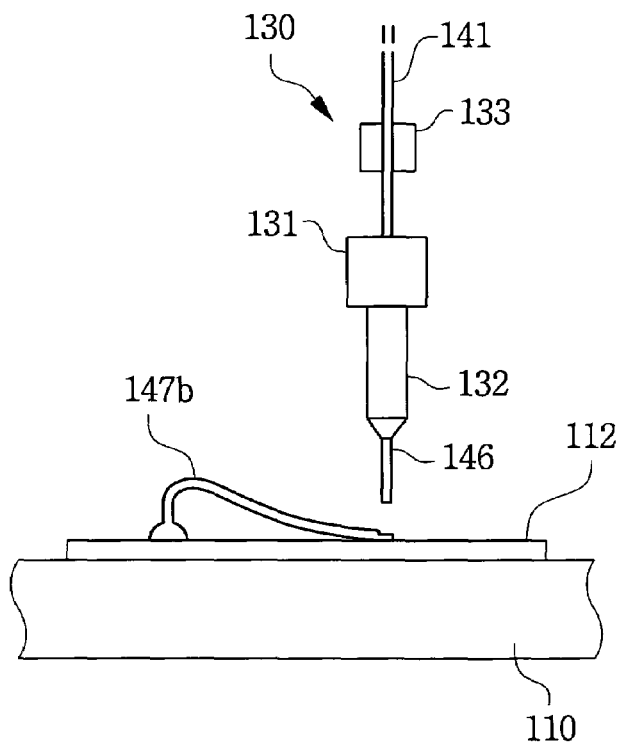

FIGS. 11A and 11B illustrate a wire tail forming operation (181 of FIG. 4). The wire tail forming operation may be performed so that the end of the disconnected wire may be removed via the pre-wire bonding operation. The wire tail forming operation may be performed at the pre-bonding stage 112 (or alternatively at the dummy substrate pad 122a of FIG. 3, for example) to form a wire tail 146, which may be used for forming a ball without defects.

The pre-wire bonding operation may be implemented as a wedge bonding operation, as shown in FIG. 11A. Here, after completing the wire detecting operation using the method illustrated in FIG. 10A, the wedge bonding operation may be performed on the pre-bonding stage 112 to form the wire tail 146 below the capillary 132. As the name implies, the wedge bonding operation may result in a wedge bonded wire 147a being provided on the pre-bonding stage 112. Wedge bonding per se may be a well known wire bonding technique in this art, and therefore a detailed description of the same is omitted.

Alternatively, the pre-wire bonding operation may be implemented as a ball bonding operation, as shown in FIG. 11B. In this case, the ball bonding operation may be performed on the pre-bonding stage 112 using the ball 149a formed by the method illustrated in FIG. 10B to form the wire tail 146 below the capillary 132. As the name implies, the ball bonding operation may result in a ball bonded wire 147b being provided on the pre-bonding stage 112. Ball bonding per se may be a well known wire boding technique in this art, and therefore a detailed description of the same is omitted.

Figure 12:
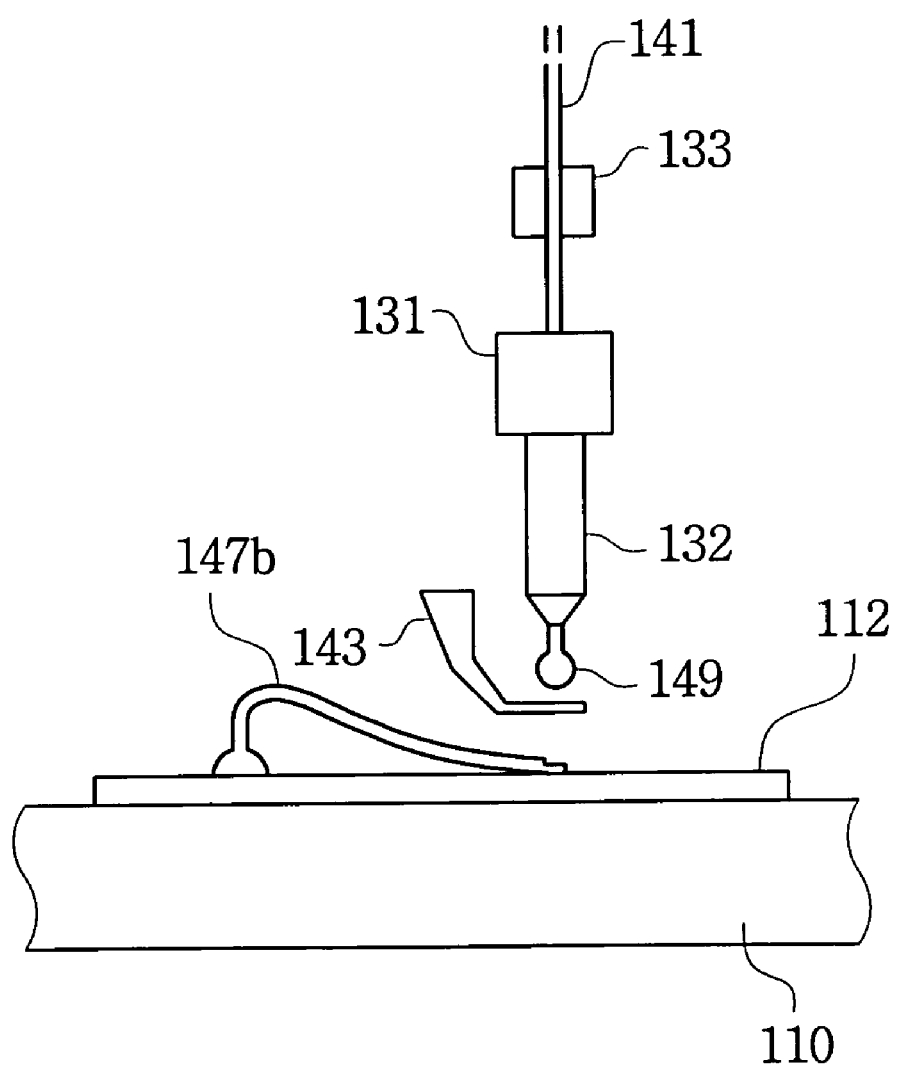
FIG. 12 is a schematic view of a ball forming operation according to an exemplary, non-limiting embodiment of the present invention.

FIG. 12 illustrates a ball forming operation (183 of FIG. 4) that may be performed. Here, the high voltage spark blade 143 may apply a high voltage spark to the wire tail to form a ball 149. In this example embodiment, the ball 149 may be formed above the pre-bonding stage 112. However, it will be appreciated that the invention is not limited in this regard. For example, the ball may 149 may be formed above the wiring substrate 120.

A unit wire bonding operation (185 of FIG. 4) may be performed to connect the semiconductor chip to the wiring substrate. The unit wire bonding operation may be performed after moving the capillary 132 from the pre-bonding stage 112 to the wiring substrate 120. An inspecting operation (187 of FIG. 4) may be performed by the WBMS 138 to determine an off-set separation of the wire bonded portion. During the inspecting operation, the WBMS 138 may (for example) determine whether re-wire bonding is necessary and generate appropriate error messages.

If the wire bonded portion off-set separation is within tolerance ("OK" at 187 of FIG. 4), then the wire bonding process (170 of FIG. 4) may be resumed. If the wire bonded portion is out of tolerance ("NOT OK" at 187 of FIG. 4), then the wire bonding apparatus may stop operating and generate errors (189 of FIG. 4) to warn the operator. Typically, faults may occur in missing a target bonding position due to (for example) wear and/or warpage of the capillary 132. Accordingly, it may be appropriate to periodically inspect the wire bonding unit 130 including the capillary 132.

Figure 13:
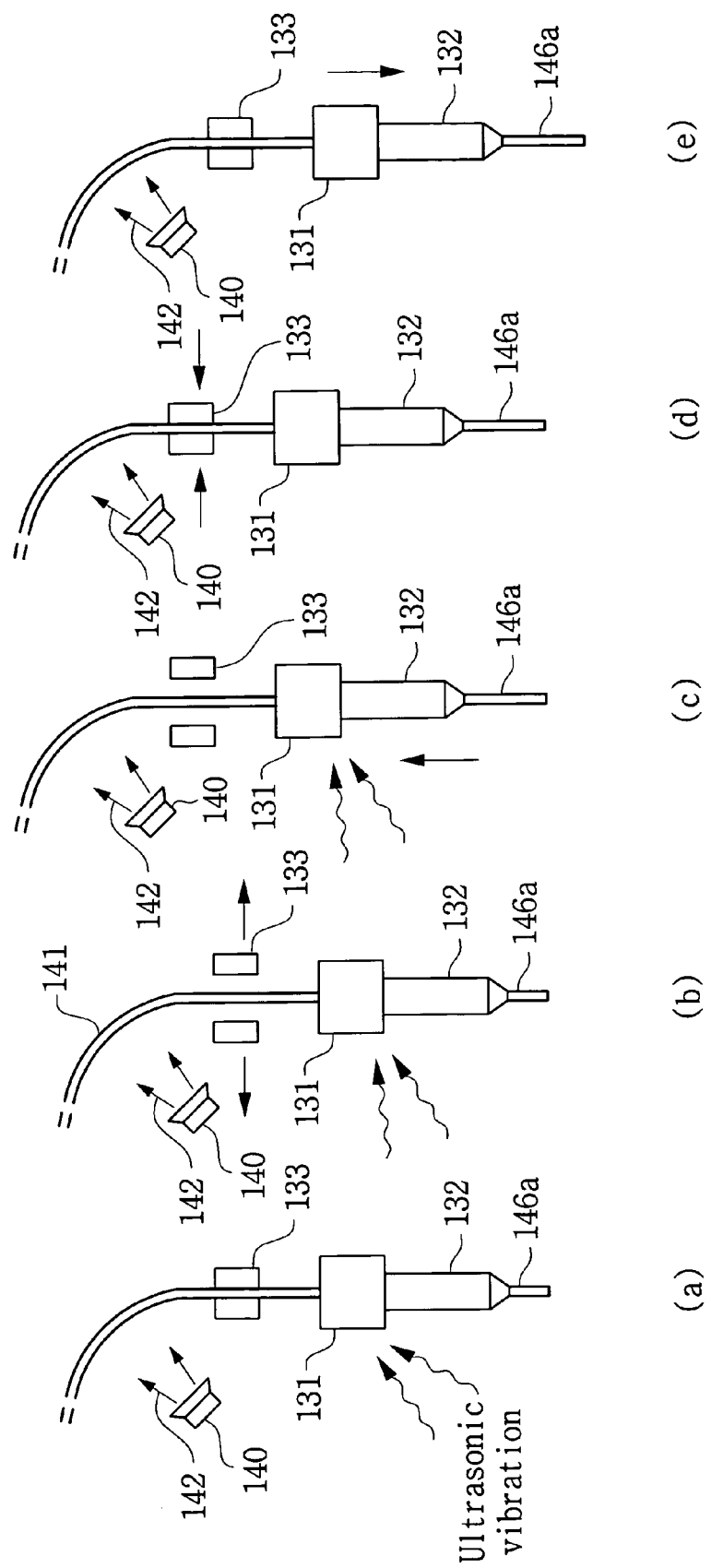
FIG. 13 is a schematic view of another exemplary, non-limiting embodiment of a wire drawing operation using the wire bonding apparatus of FIG. 2.

FIG. 13 shows another exemplary, non-limiting embodiment of the wire drawing operation (177 of FIG. 4). The wire bonding unit 130 may clamp the disconnected wire 141 and may be moved to the pre-bonding stage 112 to form a wire tail, as shown in FIG. 7.

Referring to (a) of FIG. 13, conditions are set so that the wire 141 may maintain a current position relative to the wire clamp 133, even when the wire clamp 133 may be opened. For example, the wire may maintain a state of equilibrium via air 142 that may be blown onto the wire 141 provided from the wire spool. The air 142 may apply tension to the wire 141 above the wire clamp 133 and ultrasonic vibration may be applied to the transducer 131. In this way, the ultrasonic vibration of the transducer 131 applies a wire drawing force below the wire clamp 133 that may correspond to the tension applied to the wire 141 above the wire clamp 133.

Referring to (b) of FIG. 13, the wire clamp 133 may be opened.

Referring to (c) of FIG. 13, the transducer 131 may be moved upward by a predetermined distance. The wire 141 may be relatively inactive in comparison to the transducer 131, and thus may be drawn through the capillary 132.

Referring to (d) of FIG. 13, the wire clamp 133 may be closed to clamp the wire 141.

Referring to (e) of FIG. 13, the transducer 131 may be moved downward to a position for forming a ball to complete the wire drawing operation.

In this example embodiment, the wire may be clamped and released by the wire clamp. However, it will be appreciated that the invention is not limited in this regard. For example, auxiliary clamps may be further implemented to add additional wire clamping functionality, as discussed in more detail below.

Figure 14:
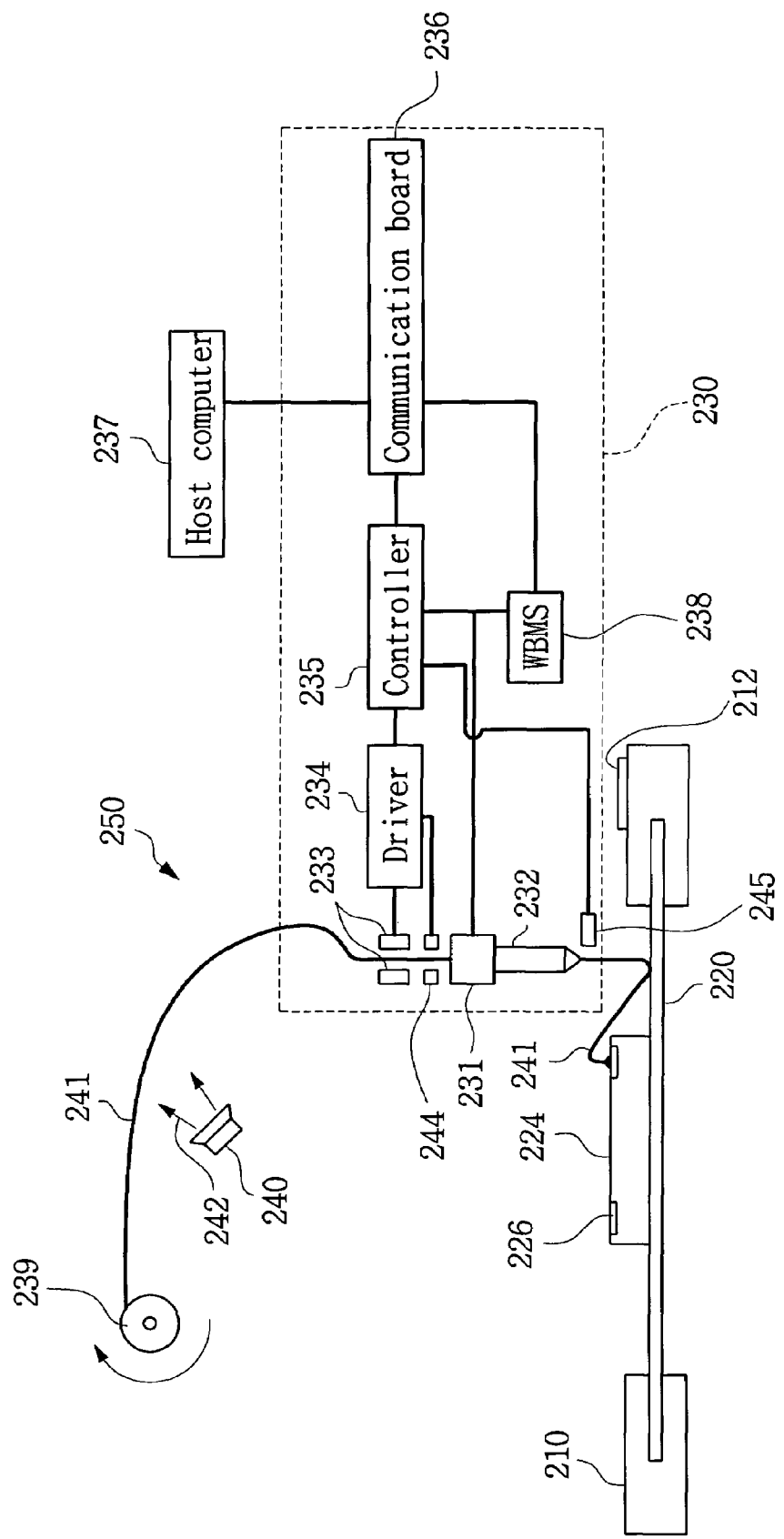
FIG. 14 is a schematic block diagram of a wire bonding apparatus having an auxiliary clamp in accordance with another exemplary, non-limiting embodiment of the present invention.

FIG. 14 is a schematic block diagram of a wire bonding apparatus 250 having an auxiliary clamp 244 in accordance with another exemplary, non-limiting embodiment of the present invention. Here, the wire bonding apparatus 250 may include an auxiliary clamp 244 and a sensor 245. The auxiliary clamp 244 may be installed between the wire clamp 233 and the capillary 232 and the auxiliary clamp 244 may be configured to clamp the wire 241. The sensor 245 may be installed below the capillary 232. The sensor 245 may be configured to measure the length of the wire 241 drawn through the capillary 232 and detect the position of the ball formed at the wire tail.

The sensor 245 may measure the length of the wire 241 drawn through the capillary 232 to determine the movement distance of the capillary 232. The sensor 245 may include an optical sensor, an optical camera, or some other conventional sensor that may be well known in this art.

The auxiliary clamp 244 may be a roller type clamp or a plate type clamp. The opening and closing of the auxiliary clamp 244 may be controlled by a controller 235. This example embodiment may be structurally and functionally similar to the first example embodiment. In this example embodiment, however, the wire drawing operation may be performed using the auxiliary clamp 244 and the sensor 245.

Figure 15:
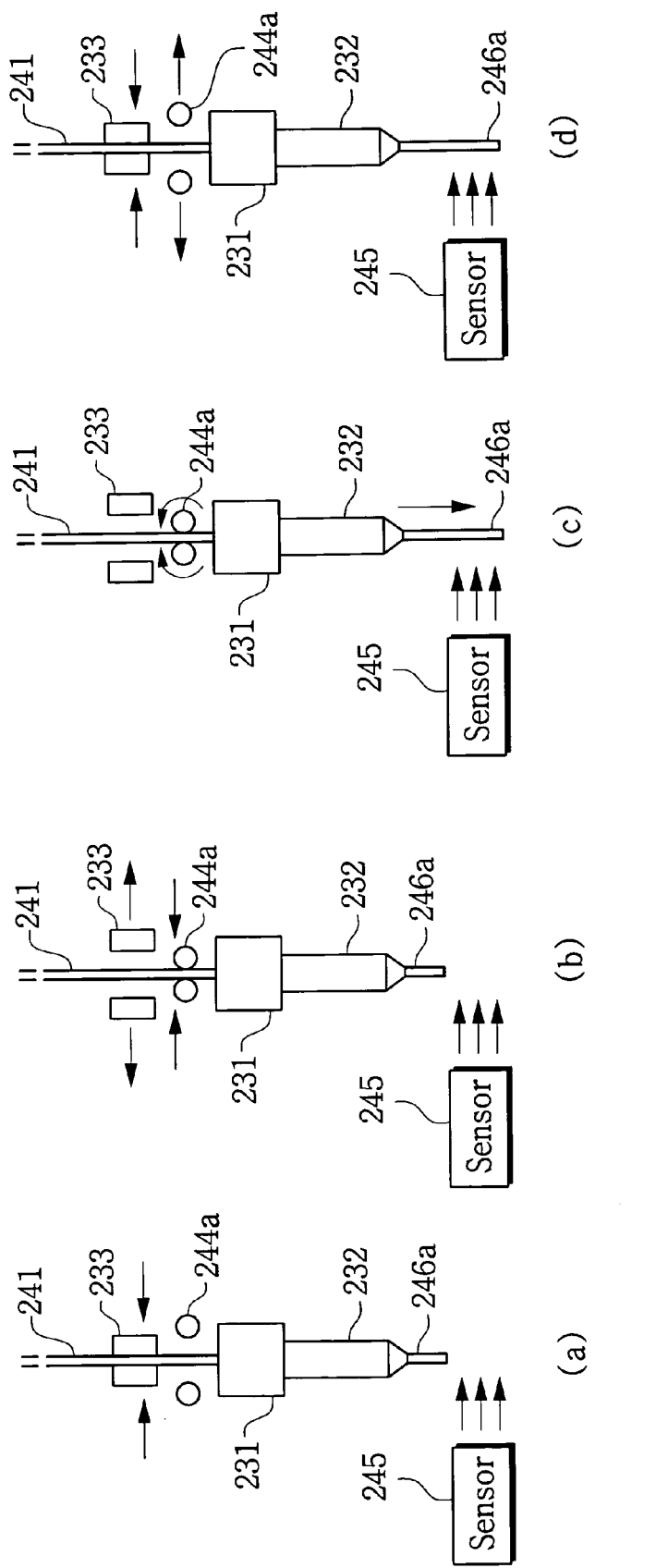
FIG. 15 is a schematic view of a wire drawing operation using a roller type auxiliary clamp in accordance with an exemplary, non-limiting embodiment of the present invention.

FIG. 15 illustrates a wire drawing operation that may be performed using an auxiliary clamp 244a of a roller type that may include a pair of cooperating rollers. If the wire 241 becomes unintentionally disconnected, the wire clamp 233 (similar to the wire clamp 133 of FIG. 2) may be closed to clamp the disconnected wire 241, as shown in (a) of FIG. 15.

Referring to (b) of FIG. 15, the sensor 245 may detect the length of the exposed end portion 246a of the wire and transmit wire length information to the controller (235 of FIG. 14). The auxiliary clamp 244a may be closed to clamp the wire 241 and the wire clamp 233 may be opened.

The roller type auxiliary clamp 244a may be rotatably driven by a motor attached thereto. The motor may rotate to adjust the location of the exposed end portion 246a.

Referring to (c) of FIG. 15, the controller (235 of FIG. 14) may actuate the motor to rotate the rollers of the auxiliary clamp 244a, thereby drawing the exposed end portion 246a of the wire through the capillary 232. The exposed end portion 246a may be drawn through the capillary 232 a length corresponding to the wire length information provided by the sensor 245.

Referring to (d) of FIG. 15, the open wire clamp 233 may be closed to clamp the wire 241. The auxiliary wire clamp 244a may be opened.

The roller type auxiliary clamp 244a may allow the wire drawing operation to be performed without vertical movement of the transducer 231.

Figure 16:
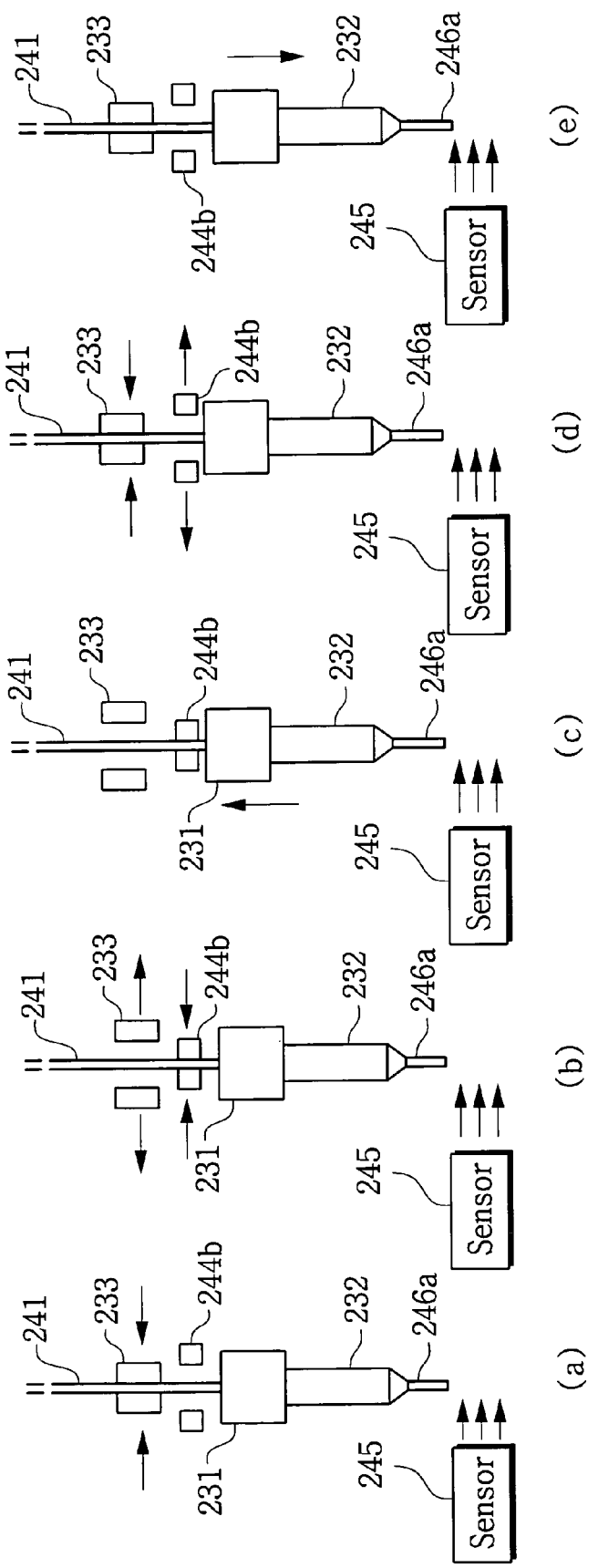
FIG. 16 is a schematic view of a wire drawing operation using a plate type auxiliary clamp in accordance with an exemplary, non-limiting embodiment of the present invention.

FIG. 16 illustrates a wire drawing operation that may be performed using an auxiliary clamp 244b of a plate type that may include a pair of cooperation plates. The plate type auxiliary clamp 244b may be similar to the wire clamp 233.

Referring to (a) of FIG. 16, if the wire 241 becomes unintentionally disconnected, then the wire clamp 233 (similar to the wire clamp 133 of FIG. 2) may be closed to clamp the disconnected wire 241. The sensor 245 may measure the length of the exposed end portion 246a of the wire and transmit wire length information to the controller (235 of FIG. 14) and the host computer (237 of FIG. 14). The controller (235 of FIG. 14) may control the opening and closing of the wire clamp 233 and the auxiliary clamp 244b according to the wire length information provided by the sensor 245. The host computer (237 of FIG. 14) may control the vertical movement of the transducer 231.

Referring to (b) of FIG. 16, the auxiliary clamp 244b may be closed to clamp the wire 241. The wire clamp 233 may be opened.

Referring to (c) of FIG. 16, the transducer 231 may be moved upward to a predetermined height. The transducer 231 may be moved toward the auxiliary clamp 244b, such that the top end of the transducer 231 may be located adjacent to the low end of the auxiliary clamp 244b. Also, the transducer 231 may be moved away from the auxiliary clamp 244b, such that the low end of the wire clamp 233 may be located adjacent to the top end of the auxiliary clamp 244b.

Referring to (d) of FIG. 16, the wire clamp 233 may be closed to clamp the wire 241 and the auxiliary clamp 244b may be opened. Here, the wire 241 may not change positions.

Referring to (e) of FIG. 16, the transducer 231 may be moved away from the auxiliary clamp 244b to a position for forming a ball. The wire 241 may be moved together with the movement of the transducer 231 and the wire clamp 233.

Because the vertical movement of the transducer 231 may be limited by the auxiliary clamp 244b, a single vertical movement of the transducer 231 may not be sufficient to draw the exposed end portion 246a below the low end of the capillary 232 by the desired amount. Thus, of the movement illustrated in (b) through (e) may be repeated to draw the exposed end portion 246a below the capillary 232 to a length corresponding to the wire length information provided by the sensor 245. For example, if the wire length information transmitted from the sensor 245 to the host computer (237 of FIG. 14) is smaller than the upward travel distance of the transducer 231, a single vertical movement of the transducer 231 may be enough to complete the wire drawing operation. On the contrary, if the wire length information transmitted from the sensor 245 to the host computer (237 of FIG. 14) is larger than the upward travel distance of the transducer 231, the vertical movement of the transducer 231 may be repeated to draw the exposed end portion 246a to a length corresponding to the wire length information provided by the sensor 245. The operation of the wire clamp 233 and the auxiliary clamp 244b may be performed in concert with the vertical movement of the transducer 231.

When the plate type auxiliary clamp 244b is implemented, the wire clamp 233 and the auxiliary clamp 244b may alternately clamp the wire 241 and the transducer 231 may make a vertical movement repetitively, thereby drawing the wire 246a below the capillary 232 to a length corresponding to the wire length information provided by the sensor 245.

The position of the ball (which may be formed via the pre-wire bonding operation) may be adjusted using the sensor 245.

In accordance with the example embodiments, a controller may control the opening and closing of a wire clamp, thereby clamping an unintentionally disconnected wire substantially simultaneously with the occurrence of the wire disconnection. Therefore, the present invention may prevent the disconnected wire from slipping through (and becoming removed from) the capillary.

The end of the disconnected wire may be removed at a pre-bonding stage that may be installed on a transfer rail. The occurrence of a wire bonding fault, which may result from the use of the disconnected wire, may be minimized.

Further, a series of operations from a wire clamping operation to a ball forming operation may be automated, thereby improving the operational efficiency of a wire bonding apparatus.

Although certain exemplary embodiments of the present invention have been described in detail, it will be understood that many variations and/or modifications of the basic inventive concepts may become apparent to those skilled in the art when instructed by this disclosure. Such variations and modifications will still fall within the spirit and scope of the present invention as defined in the following claims.

What is claimed is:

1. A wire bonding apparatus comprising:
    a transfer rail accommodating at least one wiring substrate having at least one semiconductor chip; and a wire bonding unit configured to electrically connect the semiconductor chip to the wiring substrate by a wire; the wire bonding unit including:
    a transducer having a capillary receiving the wire;
    a wire clamp movable together with the capillary;
    a wire bonding monitoring system configured to monitor an electric current at the transducer;
    a controller that closes the wire clamp to clamp a disconnected wire in response to receiving a wire disconnection signal provided by the wire bonding monitoring system; and
    a pre-bonding stage installed on the transfer rail, the pre-bonding stage at which an end of the disconnected wire is removed from the capillary by bonding the end of the disconnected wire to the pre-bonding stage.

2. The apparatus according to claim 1, wherein the pre-bonding stage is elongated in an installation direction of the transfer rail.

3. The apparatus according to claim 1, wherein the wire bonding unit is installed between a wire supply spool and the transfer rail, and the wire bonding unit further includes an auxiliary clamp for clamping the wire.

4. The apparatus according to claim 3, wherein the auxiliary clamp is a pair of rollers that operate to draw the wire through the capillary.

5. The apparatus according to claim 3, wherein the auxiliary clamp is a pair of plates that clamp the wire alternately with the wire clamp to draw the wire through the capillary with a vertical movement of the transducer.

6. The apparatus according to claim 5, wherein the transducer is moveable in a first direction such that the top end of the transducer is located adjacent to the low end of the auxiliary clamp and the transducer is moveable in a second direction, which is opposite to the first direction, such that the low end of the wire clamp is located adjacent to the top end of the auxiliary clamp.

7. The apparatus according to claim 3, further comprising:
    a sensor installed at the low end of the capillary, the sensor for measuring the location of a ball formed at a wire tail of the wire extending from the capillary.

8. A method for automatically forming a ball, comprising:
    closing a wire clamp by a controller in response to receiving a wire disconnection signal provided by a wire bonding monitoring system so that a disconnected wire is clamped;

moving the wire to a specific position other than a semiconductor chip for forming a wire tail;

opening the wire clamp and drawing the wire through the capillary to a predetermined length;

pre-wire bonding the drawn wire to the specific position to form a wire tail and remove an end of the disconnected wire by bonding the end of the disconnected wire to the specific position; and applying a spark to the wire tail to form a ball.

9. The method according to claim 8, wherein an end of the wire clamped by the wire clamp is located inside the capillary.

10. The method according to claim 8, wherein the specific position for forming the wire tail is on a pre-bonding stage.

11. The method according to claim 8, wherein the specific position for forming the wire tail is on a dummy substrate pad of a wiring substrate.

12. The method according to claim 8, wherein moving the wire to the specific position comprises:

moving the transducer from a position above the wiring substrate to the specific position; and moving the transducer toward an upper surface of the specific position.

13. The method according to claim 12, wherein drawing the wire comprises:

applying ultrasonic vibration to the transducer to draw the wire through the capillary; and closing the wire clamp.

14. The method according to claim 12, wherein drawing the wire comprises:

moving the transducer upward to a predetermined height and drawing the wire through the capillary; and closing the wire clamp; and moving the transducer downward to a position for forming a ball.

15. The method according to claim 12, further comprising:

clamping the wire with an auxiliary clamp installed between the wire clamp and the capillary.

16. The method according to claim 15, wherein the auxiliary clamp is a pair of rollers and drawing the wire comprises:

clamping the wire with the pair of rollers and opening the wire clamp;

drawing the wire through the capillary by rotating the rollers; and closing the wire clamp to clamp the wire and opening the rollers.

17. The method according to claim 15, wherein the auxiliary clamp is a pair of plates and drawing the wire comprises:

clamping the wire with the auxiliary clamp and opening the wire clamp;

moving the transducer upward to a predetermined height to draw the wire through the capillary to a predetermined length;

closing the wire clamp to clamp the wire and opening the auxiliary clamp; and moving the transducer downward to a position for forming a ball.

18. The method according to claim 8, wherein drawing the wire further comprises detecting whether a predetermined length of the wire is drawn through the capillary.

19. The method according to claim 18, wherein the detecting comprises:

moving the transducer toward the specific position and;

monitoring an electric current at the transducer according to a contact between the drawn wire and the specific position, whereby the wire is detected.

20. The method according to claim 18, wherein the detecting comprises:

applying a high voltage spark to the wire; and monitoring an electric current at the transducer, whereby the wire is detected.

21. The method according to claim 8, wherein the pre-wire bonding is a wedge bonding.

22. The method according to claim 8, wherein the pre-wire bonding is a ball bonding.

23. The method according to claim 8, further comprising:

moving the wire from the specific position toward a wiring substrate;

unit wire-bonding a semiconductor chip to the wiring substrate; and inspecting an off-set separation of a wire bonded portion.

* * * * *